United States Patent [19]
Koide et al.

[11] Patent Number: 6,016,251
[45] Date of Patent: Jan. 18, 2000

[54] PRINTED CIRCUIT BOARD AND COOLING SYSTEM THEREFOR

[75] Inventors: Hiromichi Koide; Shinya Suzuki; Tatsuaki Suzuki, all of Tokyo, Japan

[73] Assignee: Ando Electric Co., Ltd., Tokyo, Japan

[21] Appl. No.: 09/198,246

[22] Filed: Nov. 24, 1998

[30] Foreign Application Priority Data

Nov. 27, 1997 [JP] Japan ..................... 9-326764

[51] Int. Cl.⁷ ..................................... H05K 7/20
[52] U.S. Cl. ................. 361/699; 361/719; 361/720; 165/80.4; 165/104.35
[58] Field of Search ................. 361/698–700, 361/719, 720; 174/15.1, 15.2; 165/80.4, 104.33, 185

[56] References Cited

U.S. PATENT DOCUMENTS

| | | | |
|---|---|---|---|
| 3,481,393 | 12/1969 | Chu | 361/699 |
| 5,457,603 | 10/1995 | Leeb | 165/80.4 |
| 5,826,643 | 10/1998 | Galyon et al. | 165/80.4 |
| 5,920,457 | 7/1999 | Lamb et al. | 361/699 |
| 5,923,533 | 7/1999 | Olson | 361/699 |

*Primary Examiner*—Donald Sparks
*Assistant Examiner*—Boris L. Chervinsky
*Attorney, Agent, or Firm*—Finnegan, Henderson, Farabow, Garrett & Dunner, L.L.P.

[57] ABSTRACT

The present application discloses a printed circuit board and a cooling system for a printed circuit board which comprise a unitary cooling line which is arranged on an upper face of the printed circuit board and a bottom face of the printed circuit board and winds back and forth in a plan which is parallel to the printed circuit board in order for coolant to flow along the upper and bottom faces of the printed circuit board, heat conducting members which make contact with a component which is mounted on the printed circuit board and are detachably connected to the first heat conducting member and are detachably connected with the cooling line by a connecting mechanism.

18 Claims, 6 Drawing Sheets

PRINTED CIRCUIT BOARD AND COOLING SYSTEM THEREFOR

FIELD OF THE INVENTION

The present invention relates to a printed circuit board and a cooling system the therefor, especially for a structure of a pipe line for efficiently cooling mounted parts, i.e. components, e.g. ICs, which are arranged in high density on the printed circuit board. The present invention also relates to a structure of a printed circuit board which minimizes the duration of the mounting process and is easily maintained by an operator. This application is based on the patent application No. Hei 9-326764 filed in Japan, the content of which is incorporated herein by reference.

BACKGROUND ART

Figure 5:
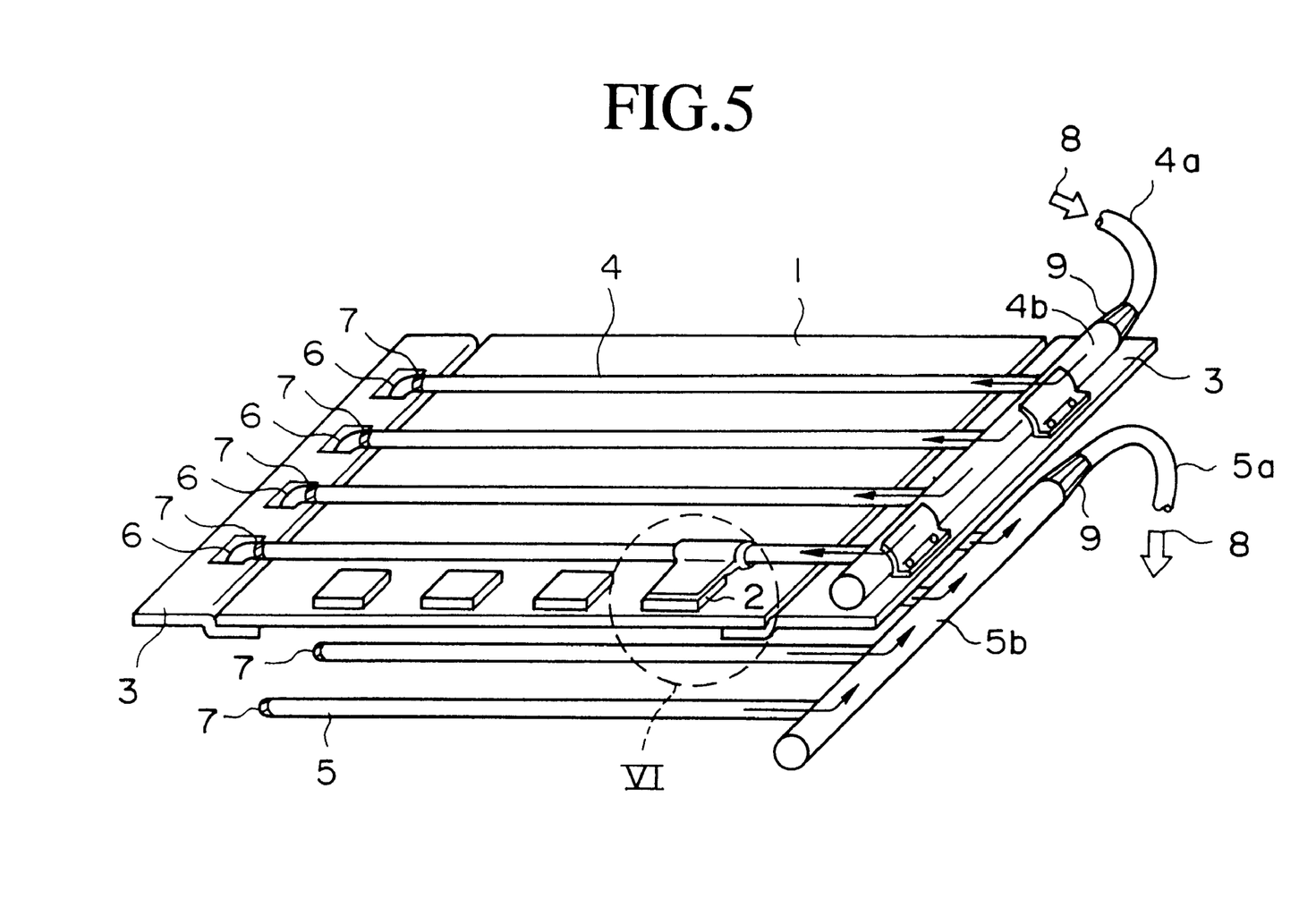
FIG. 5 is an angled view of an entire printed circuit board of an example of the background art.
Figure 6:
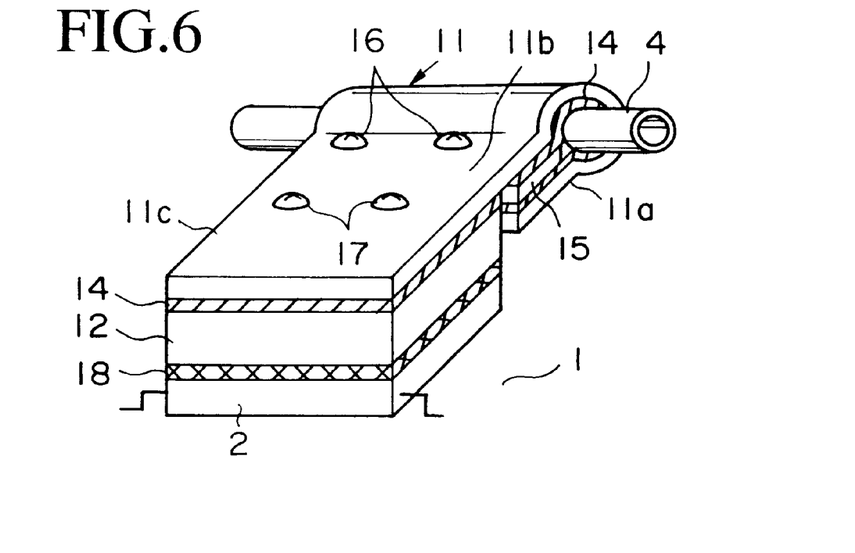
FIG. 6 is an enlarged angled view of the portion VI of FIG. 5.

FIG. 5 is a schematic view of background art for a system for cooling a printed circuit board. FIG. 6 is an enlarged view of a component A of FIG. 5. ICs 2 are mounted on a printed circuit board 1 which is supported between a pair of rails 3 which are arranged in parallel. Cooling pipes 4 which are branched from a header pipe 4b are arranged on an upper face of the printed circuit board 1. Cooling pipes 5 are arranged on a bottom face of the printed circuit board 1. Each cooling pipe 5 is connected to the cooling pipe 4 by a flexible tube 6, a joint pipe 7 and an another flexible tube 6. The flexible tube 6 is made of urethane resin. The cooling pipes 5 are connected to a confluence pipe 5b. A coolant supplied from an origin 8 flows to the header pipe 4b through a flexible tube 4a which is connected to the header pipe 4b by a joint 9. The confluence pipe 5b is connected to a flexible tube 5a by a joint 9.

Figure 8:
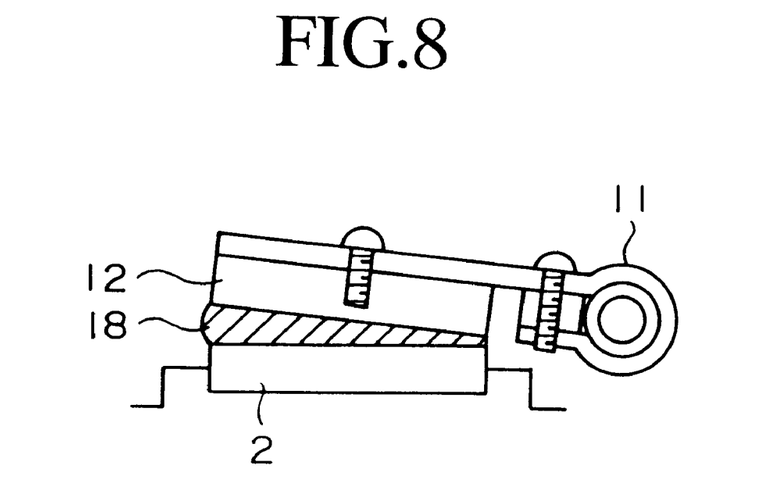
FIG. 8 is a sectional view of a cooling pipe of another example of background art.

As shown in FIG. 6 and FIG. 8, the IC 2 is fixed to the cooling pipe 4 by a J shaped elastic member 11 and a plate 12. A first end portion 11a of the elastic member 11 surrounds the cooling pipe 4 and is joined with a central portion 11b of the elastic member 11 by screws 16 in order to tightly catch the cooling pipe 4 between the first end portion 11a and the central portion 11b. Grease 14 which has a good bet conductivity is sandwiched between the elastic member 11 and the cooling pipe 4. A spacer 15 is arranged between the first end portion 11a and the central portion 11b. Screws 17 fix a second end portion 11c to the plate 12 which is bonded to an upper surface of the IC 2 by a bonding agent 18 which has a good conductivity. Grease 14 which has good heat conductivity is sandwiched between the second end portion 11c and the plate 12.

Heat of the IC 2 is transferred to the coolant, which is supplied from the origin 8 and flows in the cooling pipes 4 and 5, via the bonding agent 18, the plate 12, the grease 14, the elastic member 11 and the grease 14.

Figure 7:
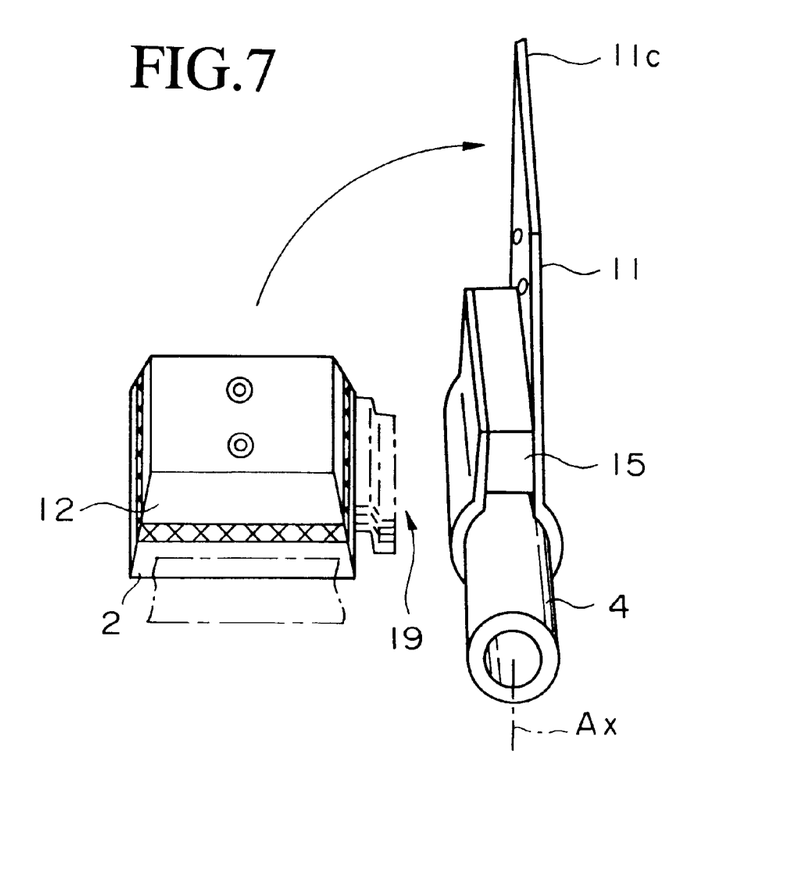
FIG. 7 is an angled view of the portion VI of FIG. 5 during checking of the lead of IC 2.

In the case of repairing the IC 2, an operator screws off the screws 17 in separate to detach the IC 2 and also screws off the screws 16 in order to depart the first end portion 11a from the central portion 11b of the elastic member 11. As shown in FIG. 7, the operator turns the elastic member 11 around an axis Ax of the cooling pipe 4 in order to separate the second end 11c from the IC 2. Then the lead wires 19, which are hidden by the cooling pipe 4 and elastic member 11, of the IC 2 are exposed to the operator, therefore the operator can easily check the leads 19 and also can check the IC 2 by using the leads 19 as terminals to which a checker which detects the characteristics of the IC 2 is touched. And the operator can also replace a failed IC with a new IC with ease.

Because the coolant flows through the header pipe 4b, the cooling pipes 4, the cooling pipes 5 and the confluence pipe 5b due to the pressure of the coolant which varies with the direction of flow of the coolant, the cooling capacity for one printed circuit board which is vertically arranged differs from the cooling capacity for another printed circuit board which is horizontally arranged. The coolant flowing through the header pipe 4b is distributed into the cooling pipes 4 and flowing resistancy of one cooling pipe 4 is not the same as another cooling pipe 4, therefore, the cooling capacity of one cooling pipe is not same as other cooling pipes.

Because the lengths of the leads 19, thicknesses of the ICs 2 and conditions of bonding between the printed circuit board 1 and the leads 19 are irregular, the distance between an upper surface of a printed circuit board 1 and an upper surface IC 2 varies. Therefore, the bottom surface of the plate 12 is not level with the upper surface of the IC 2 as shown in FIG. 8 and the heat conducting rate is low in a portion where the distance is large. Because an area of a cross section of the elastic plate 12 is not sufficient, the conductance of the heat of the conducting line from the IC 2 to the cooling pipe 4 through the plate 12 and the elastic plate 11 is high and the efficiency for cooling is not sufficient.

The elastic member 11 is attached to the cooling pipe 4 by following processes.

Figure 9:
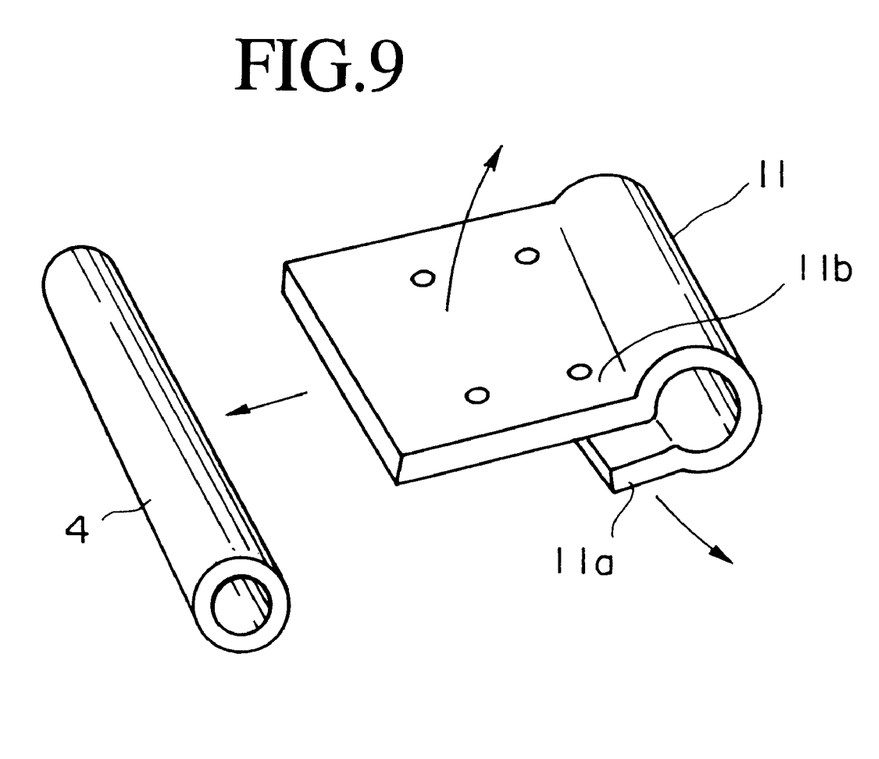
FIG. 9 is an angled view of the cooling pipe of the other background art of FIG. 8.

(i) As shown in FIG. 9, elastically bend the elastic plate 11 in order to separate the inner surface of the first end portion 11a from the inner surface of the central portion 11b.

(ii) Maintain the bent elastic plate 11 and insert the cooling pipe 4 between the first end portion 11a and the central portion 11b.

(iii) As shown in FIG. 6, insert the spacer 15 between the first end portion 11b and the central portion 11c.

(iv) Screw on the screws 16 and combine the first end portion 11b and the central portion 11c.

Because of the above complicated process for attaching the elastic plate 14, it is difficult to simplify the entire process for constructing the printed circuit board 1.

SUMMARY OF THE INVENTION

The present invention was made in the view of the above-mentioned problems. It is an object of the present invention to provide a printed circuit board and a cooling system therefor which have superior performance and aspects as explained below.

(i) Constant and high cooling capacity regardless of the position of the printed circuit board.

(ii) Good heat conductivity in spite of irregular dimensions of component.

(iii) A simplified construction process for the printed circuit board.

In order to accomplish the above object, the present application discloses a printed circuit board comprising, an unitary cooling line which is arranged on an upper face of the printed circuit board and a bottom face of the printed circuit board and winds back and forth in a plane which is parallel to the printed circuit board in order for coolant to flow along the upper and bottom faces of the printed circuit board, a first heat conducting member which is in contact with a component which is mounted on the printed circuit board and a second heat conducting member which is detachably connected to the first heat conducting member and is detachably connected to the cooling line by a connecting mechanism.

The coolant flows through the single cooling line in which the presure of the coolant is uniform, therefore, it is possible to obtain uniform cooling capacities at any portions of the cooling line regardless of the position of the printed circuit board. The second conducting member is detachably constructed with the cooling line and the first conducing member which is connected to the above mentioned component, therefore, an operator can easily disassemble the above cooling system and carry out maintenance on components on the printed circuit board.

The present application also discloses a cooling system for a printed circuit board comprising, a source of coolant, a unitary cooling line which is arranged on an upper fax of the printed circuit board and a bottom face of the printed circuit board and which winds back and forth in a plane which is parallel to the printed circuit board in order for the coolant to flow from the source of the coolant along the upper and bottom faces of the printed circuit board and also return the coolant to the source of the coolant, a first heat conducting member which makes contact with a component which is mounted on the printed circuit board and a second heat conducting member which is detachably connected to the first heat conducting member and is detachably connected to the cooling line by a connecting mechanism.

The coolant from the source flows through the single cooling line in which the pressure of the coolant is uniform, therefore, it is possible to obtain an uniform cooling capacities at any portions of the cooling line regardless of the position of the printed circuit board. The second conducting member is detachably constructed with the cooling line and the first conducting member which is connected to the above mentioned component, therefore, an operator can easily disassemble the above cooling system and carry out maintenance on the component on the printed circuit board.

The present invention also discloses a printed circuit board and a cooling system therefor in which the mechanism consists of a supporting member which is fixed to a cooling line, and a portion of a second heat conducting member which is slidably attached to the supporting member along a direction which is vertical to the printed circuit board. The second heat conducting member has a through hole whose plane figure has the shape of an oval whose longitudinal direction is perpendicular with regard to the plane of the printed circuit board and the supporting member has a threaded hole into which a screw is screwed through the through hole.

An operator can adjust the connecting position of the second conducting member in order to insulate uneven dimensions of components on the printed circuit board.

DETAILED DESCRIPTION OF THE PREFERRED EMBODIMENT

Figure 1:
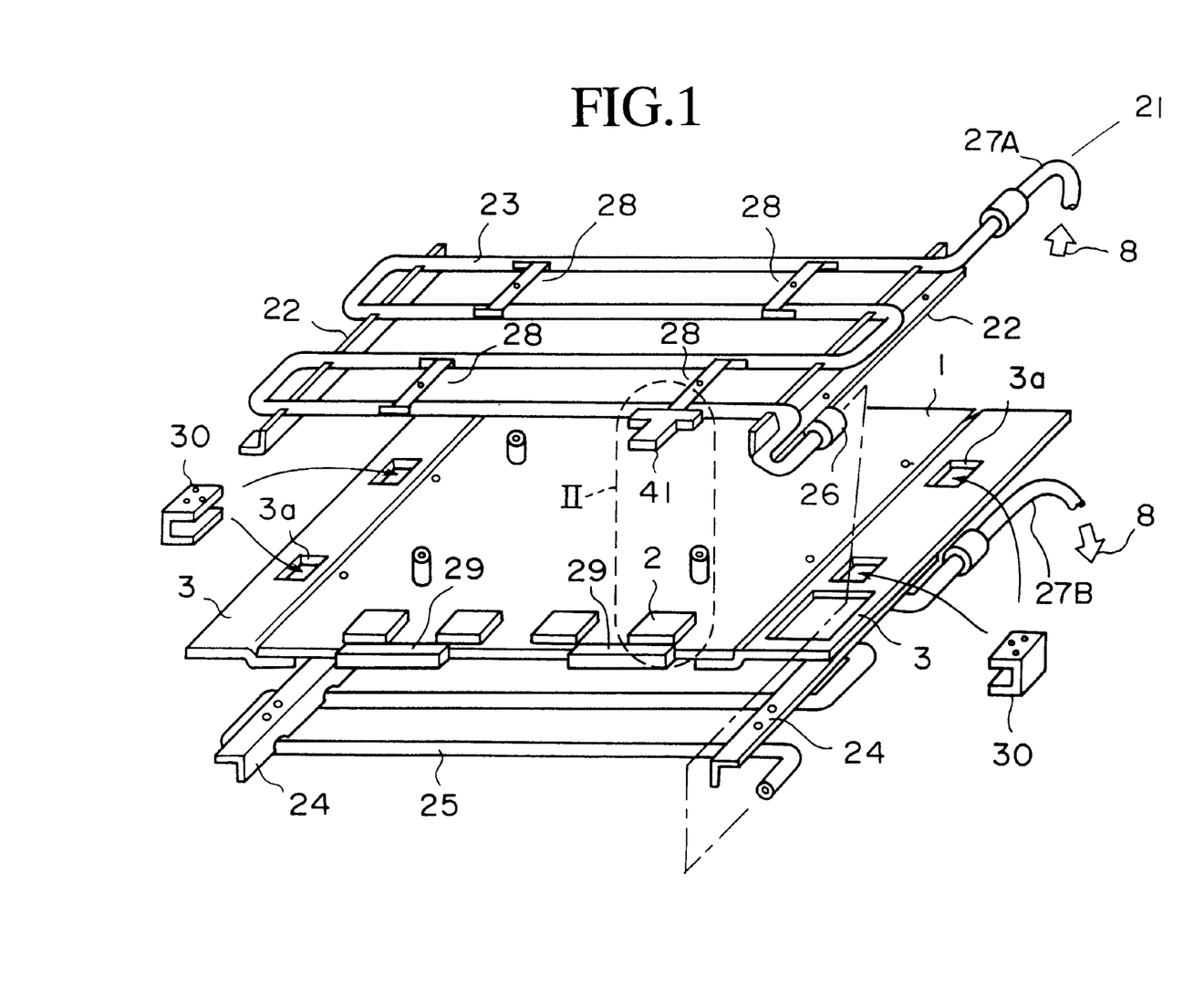
FIG. 1 is an angled view of an entire printed circuit board of a preferred embodiment of the present invention.

FIG. 1 shows an embodiment of a printed circuit board. In FIG. 1, the numeral 21 indicates a cooling line which is arranged on both sides of a printed circuit board 1 and lies in a single winding line.

The cooling line 21 consists of a first pipe 23 which is arranged on an upper face of the printed circuit board 1, a second pipe 25 which is arranged on a bottom face of the printed circuit board 1 and a union pipe joint 26 which joins the first and second cooling pipes 23 and 25. Angled bars 22 are brazed to turning portions of the first pipe 23. Angled bars 24 are brazed to turning portions of the second pipe 25. A flexible tube 27A which supplies the coolant from the source 8 of the coolant is detachably connected with an inlet of the cooling line 21 (one end of the pipe 23). A flexible tube 27B through which the coolant returns to the source 8 is detachably connected to an outlet of the cooling line 21 (one end of the pipe 25).

Pairs of parallel portions of cooling pipes 23 and 25 are connected by reinforcing members 28 in order that the cooling lines 23 and 25 do not bend out of a plane which is parallel to the printed circuit board and also in order that the coolant flowing therethrough does not cause vibration. The numeral 29 indicates a connector which electrically connects circuits in the printed circuit board 1 with other circuits (not shown in figures). The numeral 30 indicates a connecting member which is inserted into a hole 3a of the rail 3 and connects the angled bars 22 and 24 to the rail 3.

Figure 2:
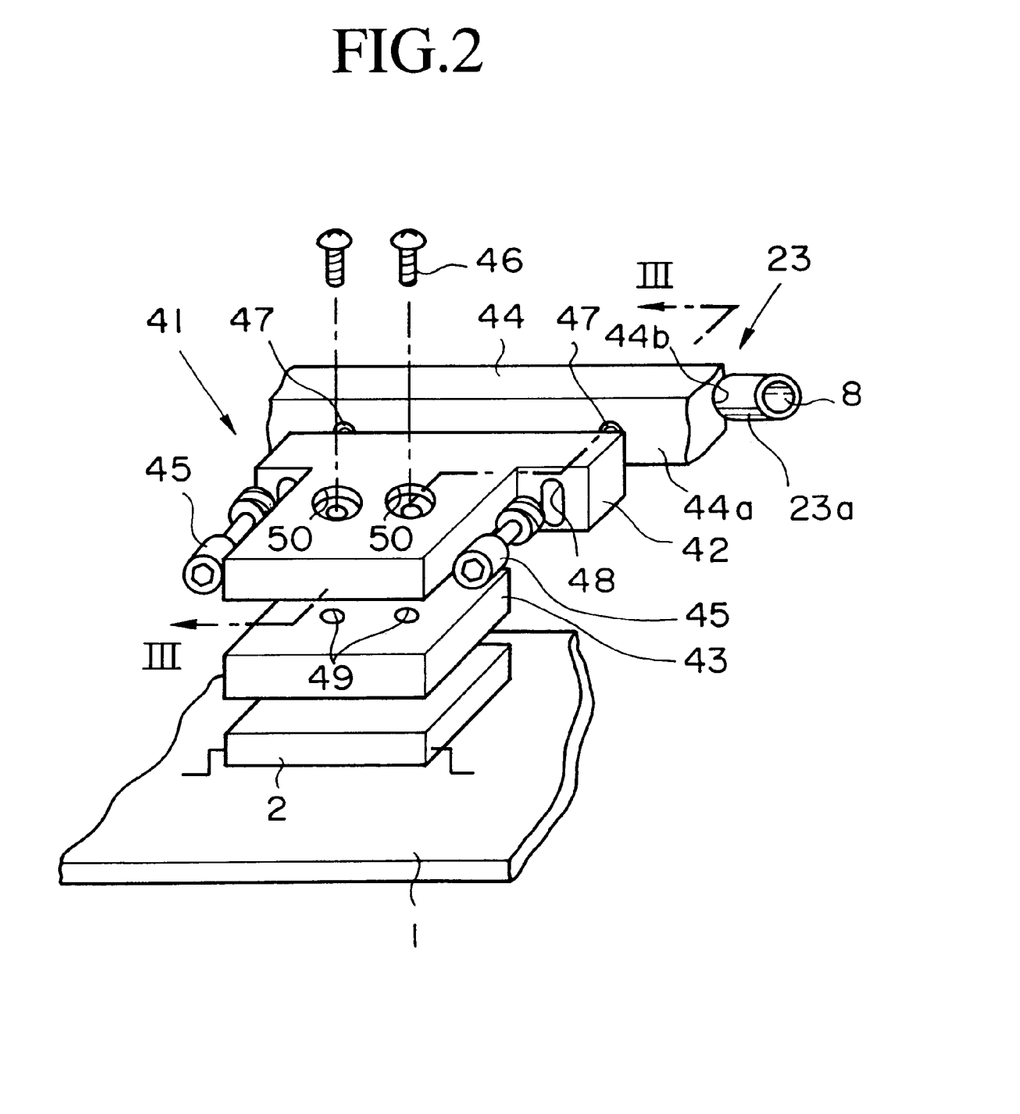
FIG. 2 is an enlarged view of the portion II of FIG. 1.

The numeral 41 indicates a heat conducting component which is supported by the pipe 23 and makes contact with the IC 2. As shown in FIG. 2, the heat conducting component 41 consists of a following specific construction.

Figure 3:
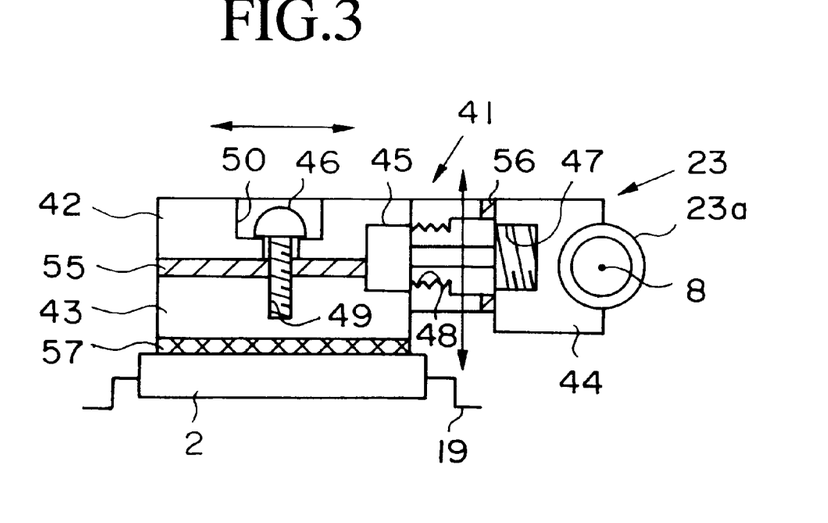
FIG. 3 is a sectional view taken along the arrows III of FIG. 2.

In FIGS. 2 and 3, the numeral 42 indicates an upper conducting member (second conducting member), the numeral 43 indicates a lower conducting member (first conducting member), the numeral 44 indicates a supporting member which is unitarily combined with the pipe 23 and has a flat face 44a to which the upper conducting member 42 is fixed and the numerals 45 and 46 indicate screws.

The upper conducting member 42 has a threaded hole 48, through which the screw 45 is screwed into the treaded hole 48, the plane figure of which has an oval shape whose longitudinal direction extends vertical to the printed circuit board 1. The screw 45 has a threaded portion which is screwed into a screw hole 47 of the supporting member 44, a head portion to be driven by a tool (not shown in the figures) and intermediate portion whose diameter is smaller than the width of the through hole 48. An operator can adjust a position of the conducting member 42 by sliding the screw 45 in the through hole 48. The conducting member 42 also has a spot faced through hole 50 through which a screw 46 is inserted into a threaded hole 49 of the lower conducting member 43 whose bottom face is bonded to the upper surface of the IC 2 by a bonding agent 57 which has a high heat conductivity. Because the through hole 50 is counter bored, a head portion of the screw 46 is enclosed in the counter bored portion of the through hole 50 and also an entire area of the surface of the upper conducting member 42 is want as to obtain a wide area for radiating the heat.

A grease 56 which has high heat conductivity is sandwiched between the upper conducting member 42 and lower conducting member 43, Materials which have good heat conductivities, such as aluminum or copper, are suitable for the pipes 23 and 25, and the first and second conducting members 42 and 43. The supporting member 44 has a slot 44b whose inner surface is attached to a component of the cylindrical surface of the pipe 23 and is brazed to the pipe 23.

The IC 2 generates heat during the operation thereof. In a printed circuit board which has the above construction for cooling, the heat of the IC 2 partially radiates from the leads 19, and the remaining heat is fed to the coolant flowing through the pipe 23 via lower conducting member 43, upper conducting member 42 and the supporting member 44, and radiates into the air. Because the coolant flows through the single cooling line 21 in which the pressure of the coolant is uniform, cooling capacities are uniform at all portions of the cooling line 21.

The above printed circuit board will be constructed by the following process.

(i) attaching the rails 3 to both ends of the printed circuit board 1;

(ii) inserting the connecting member 30 into the each of the four holes 3a which are arranged in the rail 3;

(iii) fixing the angled plate 22 which connects the pipes 23 and 25 to the connecting member 30; and (iv) fix the assembly of the IC 2, second conducting member 42 and first conducting member 43 to the supporting member 44.

Because the intermediate portion of the screw 45 is sufficiently smaller than the through hole 48, an operator can adjust the position of the second conducting member 42 which is in close contact with the IC 2 even when the height of the IC 2 or the length of the leads 19 are not uniform. The upper conducting member 42 in such contact with the IC 2 can conduct the heat generated by the IC 2 due to a good heat conductivity.

Figure 4:
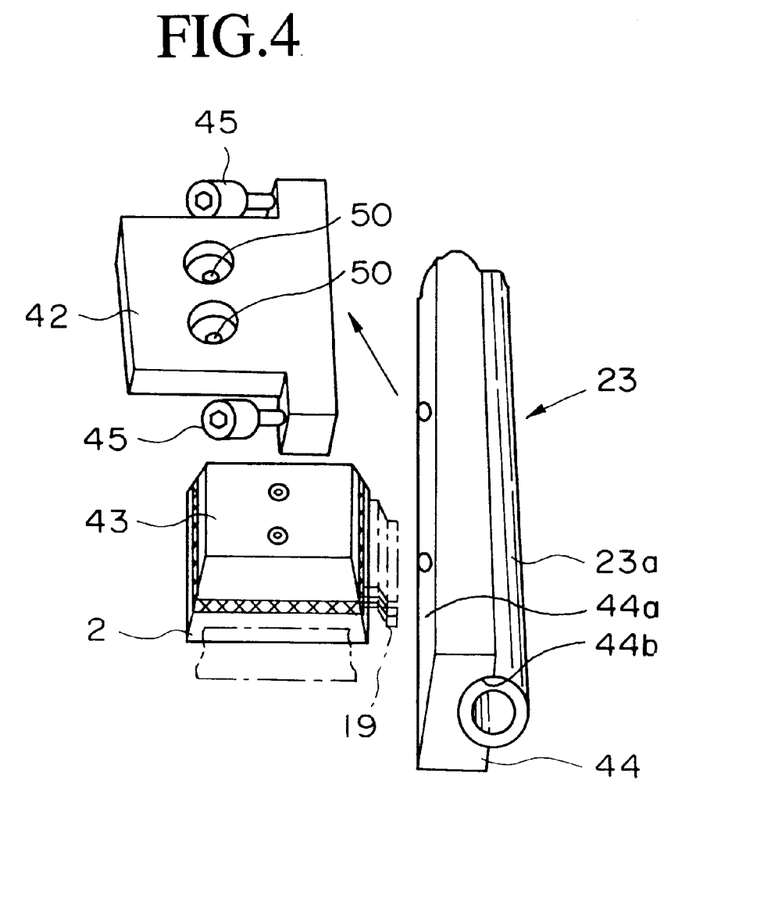
FIG. 4 is an exposed and enlarged angled view of the portion II of FIG. 1.

In checking the IC 2, an operator loosens the screws 45 and 46, and pulls off the screws 46. Then the operator gets a broad view around the IC 2 and the leads 19 thereof which have been hidden under the pipe 23 and upper conducting member 42. Therefore the operator can easily check and carry out maintenance on the IC 2 and easily replace an IC 2 which needs to be repaired with a new one.

What is claimed is:

1. A printed circuit board comprising:

a unitary cooling line which is arranged on an upper face of the printed circuit board and a bottom face of the printed circuit board and which winds back and forth in a plane which is parallel to the printed circuit board in order for coolant to flow along the upper and bottom faces of the printed circuit board;

a first heat conducting member which makes contact with a component which is mounted on the printed circuit board;

a second heat conducting member which is detachably connected to the first heat conducting member and is detachably connected to the unitary cooling line by a connecting mechanism.

2. A printed circuit board as claimed in claim 1, wherein said connecting mechanism consists of a supporting member which is fixed to the unitary cooling line, a portion of the second heat conducting member which is slidably attached to the supporting member along a direction which is vertical to the printed circuit board.

3. A printed circuit board as claimed in claim 2, wherein said second heat conducting member has a first through hole which plane figure is an oval shape whose longitudinal direction extends vertical to the printed circuit board, and said supporting member has a threaded hole into which a first screw is screwed through the first through hole.

4. A printed circuit board as claimed in claim 3, wherein said second heat conducting member has a through hole which is vertical to the printed circuit board and through which a second screw to be screwed into a threaded hole which is arranged in the first heat conducting member.

5. A printed circuit board as claimed in claim 4, wherein said second through hole which is vertical to the printed circuit board is counter bored in order to house a head portion of the second screw which is screwed into the threaded hole of the first heat conducting member.

6. A printed circuit board as claimed in claim 3, wherein said first screw which is screwed into the threaded hole of the supporting member has a threaded portion which is screwed into the threaded hole of the supporting member, a head portion to be driven by a tool and an intermediate portion, whose diameter is smaller than a width of the through hole, between the threaded portion and the head portion.

7. A printed circuit board as claimed in claim 4, wherein said first screw which is screwed into the threaded hole of the supporting member has a threaded portion which is screwed into the threaded hole of the supporting means, a head portion to be driven by a tool and an intermediate portion, whose diameter is smaller than a width of the through hole, between the threaded portion and the head portion.

8. A printed circuit board as claimed in claim 1, wherein said first conducting member is bonded to the component by a bonding agent which has high heat conductivity.

9. A printed circuit board as claimed in claim 5, wherein said first conducting member is bonded to the component by a bonding agent which has high heat conductivity.

10. A cooling system comprising:

a source of a coolant;

a unitary cooling line which is arranged on an upper face of the printed circuit board and a bottom face of the printed circuit board and which winds back and forth in a plane which is parallel to the printed circuit board in order for the coolant to flow from the source of the coolant along the upper and bottom faces of the printed circuit board and also return the coolant to the source of the coolant;

a first heat conducting member which makes contact with a component which is mounted on the printed circuit board;

a second heat conducting member which is detachably connected to the first heat conducting member and which is detachably connected to the unitary cooling line by a connecting mechanism.

11. A cooling system as claimed in claim 10, wherein said connecting mechanism consists of a supporting member which is fixed to the unitary cooling line, and a portion of the second heat conducting member which is slidably attached to the supporting member along a direction which is vertical to the printed circuit board.

12. A cooling system as claimed in claim 11, wherein said second heat conducting member has a first through hole whose plane figure is an oval shape which longitudinal direction extends vertically to the printed circuit board, and said supporting member has a threaded hole into which a first screw is screwed through the first through hole.

13. A cooling system as claimed in claim 12, wherein said second heat conducting member has a through hole which is vertical to the printed circuit board and through which a screw to be screwed into a threaded hole which is arranged in the first heat conducting member.

14. A cooling system as claimed in claim 13, wherein said second through hole which is vertical to the printed circuit board is counter bored in order to house a head portion of the screw which is screwed into the threaded hole of the first conducting member.

15. A cooling system as claimed in claim 12, wherein said first screw which is screwed into the threaded hole of the supporting member has a threaded portion which is screwed into the threaded hole of the supporting member, a head portion to be driven by a tool and an intermediate portion the width of which is smaller than a width of the through hole between the threaded portion and the head portion.

16. A cooling system as claimed in claim 13, wherein said first screw which is screwed into the threaded hole of the supporting member has a threaded portion which is screwed into the threaded hole of the supporting member, a head portion to be driven by a tool and an intermediate portion a width of which is smaller than a width of the first through hole between the threaded portion and the head portion.

17. A cooling system as claimed in claim 10, wherein said first conducting member is bonded with the component by a bonding agent which has high heat conductivity.

18. A printed circuit board as claimed in claim 14, wherein said first conducting member is bonded with the component by a bonding agent which has high heat conductivity.

* * * * *